United States Patent [19]
Ye et al.

[11] Patent Number: 5,891,348
[45] Date of Patent: Apr. 6, 1999

[54] PROCESS GAS FOCUSING APPARATUS AND METHOD

[75] Inventors: Yan Ye, Campbell; Gerald Zheyao Yin, Sunnyvale; Diana Xiaobing Ma, Saratoga; Steve S. Y. Mak, Pleasanton, all of Calif.

[73] Assignee: Applied Materials, Inc., Santa Clara, Calif.

[21] Appl. No.: 592,821

[22] Filed: Jan. 26, 1996

[51] Int. Cl.$^6$ ........................................... H05H 1/00
[52] U.S. Cl. .................. 216/67; 216/68; 156/345; 118/723 R; 118/723 I; 204/298.15; 204/298.31; 427/569; 438/710; 438/729
[58] Field of Search ................. 156/345; 118/723 E, 118/723 I, 723 R; 204/298.34, 298.31, 298.15; 438/710, 729; 216/67, 68

[56] References Cited

U.S. PATENT DOCUMENTS

| | | | |
|---|---|---|---|
| 4,645,218 | 2/1987 | Ooshio et al. | 279/1 M |
| 4,869,801 | 9/1989 | Helms et al. | 204/298 |
| 5,213,658 | 5/1993 | Ishida . | |
| 5,228,501 | 7/1993 | Tepman et al. | 165/80.1 |
| 5,246,532 | 9/1993 | Ishida . | |
| 5,271,788 | 12/1993 | Hasegawa et al. | 156/345 |
| 5,298,465 | 3/1994 | Levy . | |
| 5,330,607 | 7/1994 | Nowicki | 156/345 |
| 5,352,294 | 10/1994 | White et al. | 118/725 |
| 5,423,918 | 6/1995 | Gupta et al. . | |
| 5,552,124 | 9/1996 | Su | 156/345 |

FOREIGN PATENT DOCUMENTS 62-35627  2/1987  Japan .

*Primary Examiner*—Thi Dang
*Attorney, Agent, or Firm*—Ashok K. Janah; James C. Wilson

[57] ABSTRACT

An apparatus (20) for uniformly processing substrates (25) having a surface with a center (80) and a peripheral edge (85). The apparatus (20) comprises (i) a process chamber (30) having a gas distributor (55) for distributing process gas in the process chamber (30); (ii) a support (75) for supporting a substrate (25) in the process chamber (30); (iii) a plasma generator for forming a plasma from the process gas in the process chamber (30); and (iv) a focus ring (90) in the process chamber (30). The focus ring (90) comprises (a) a wall (95) surrounding the substrate (25) to substantially contain the plasma on the substrate surface, and (b) a channel (100) in the wall (95). The channel (100) has an inlet (105) adjacent to, and extending substantially continuously around the peripheral edge (85) of the substrate surface. The inlet (105) of the channel (100) has a width w sized to allow a sufficient amount of process gas to flow into the channel (100) to maintain substantially equal processing rates at the center (80) and peripheral edge (85) of the substrate surface.

54 Claims, 7 Drawing Sheets

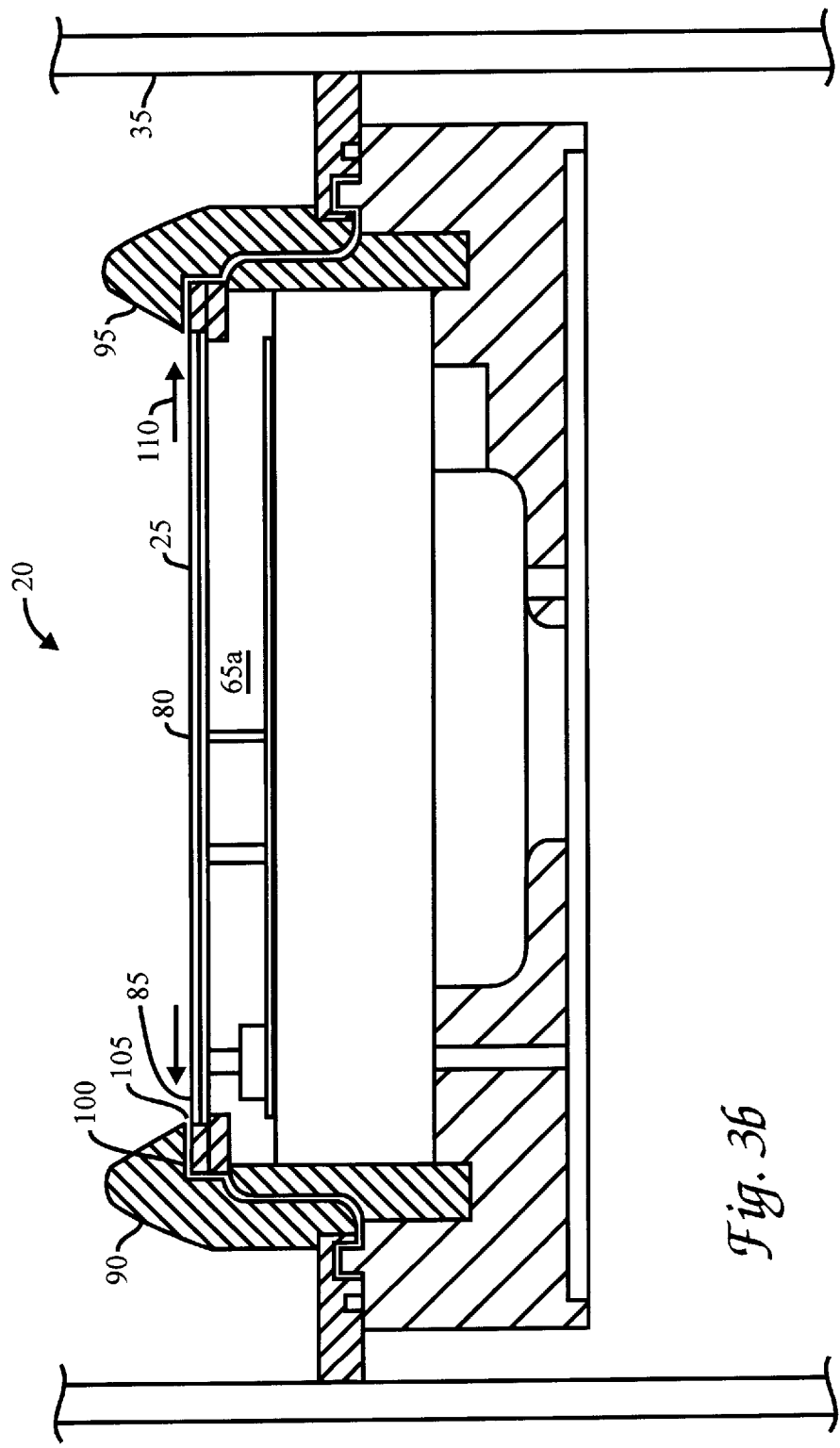

PROCESS GAS FOCUSING APPARATUS AND METHOD

BACKGROUND

This invention relates to an apparatus and method for uniformly processing a substrate and reducing particulate contamination of the substrate, the invention being particularly useful in plasma processes.

In semiconductor fabrication processes, process gases are used to deposit material upon, etch, or clean semiconductor substrates. Semiconductor processes are typically carried out in an enclosed process chamber having gas distributors for distributing process gas in the chamber. One problem with conventional process chambers is their relative inability to achieve a uniform distribution or concentration of reactive process gas species across the substrate surface, particularly at the peripheral edge of the substrate. The distribution of reactive process gas species across the substrate affects the uniformity and rate of processing of the substrate. For example, a process chamber 10 having a single process gas distributor 11a positioned directly above the substrate 12, as shown in FIG. 1, causes an asymmetric distribution of reactive process gas across the substrate 12, with the concentration of reactive process gas highest at the center 13 of the substrate and lowest at the peripheral edge 14 of the substrate. Conversely, a process gas distributor 11b positioned around the peripheral edge 14 of the substrate causes the concentration of reactive process gas to be highest at the peripheral edge 14 of the substrate and lowest at the center 13 of the substrate. The concentration of reactive process gas across the substrate 12 can also vary when the flow of process gas across the surface of the substrate is unrestrained, such as for example, when the process gas can freely flow around the peripheral edge 14 of the substrate 12.

The concentration gradient of reactive process gas across the substrate 12 can be reduced using process gas containment structures to contain the flow of process gas on the substrate 12. For example in plasma processes, it is known to use a focus ring 15 around the substrate to maintain a more uniform distribution of the reactive process gas on the surface of the substrate 12. However, one problem with conventional plasma focus rings is that the process gas stagnates at the portion 16 of the focus ring 15 adjacent to the peripheral edge 14 of the substrate 12 to form contaminant particles 17 that flake off and contaminant the substrate 12, as shown in FIG. 1. It is difficult to non-destructively detect the contamination during the processing of the substrate, and it is only in the final processing stages when the fully processed semiconductor substrates are worth between $50,000 to $100,000 each, that the contaminants are discovered, and the entire substrate is rejected.

Several conventional methods are used to reduce particulate contamination of the substrate. In one method, the process chamber and the components therein are periodically cleaned to remove the deposits formed on the components using plasmas of corrosive gases, such as $NF_3$ plasmas. However, the corrosive plasmas erode the processing components and limit the life of the process chamber. Also, the cleaning process step increases the down time of the apparatus and reduces process throughput.

Another solution to the particulate contamination problem taught by U.S. Pat. No. 5,423,918 to Gupta, et al., involves a final processing step of raising the focus ring above the substrate and flowing inert gas in the chamber to flush out the contaminant particulates accumulated in this region. However, mechanical stresses resulting from raising and lowering of the focus ring can dislodge the deposits formed on the focus ring to form additional contaminant particulates in the process chamber. Also, the steps of raising and lowering the focus ring lengthens overall processing time and reduces process efficiency.

Thus, there is a need for a substrate processing apparatus capable of maintaining a substantially uniform concentration of reactive process gas across the substrate surface, and in particular, at the peripheral edge of the substrate. There is also a need for an apparatus and method that reduces formation of particulate contaminants in the process chamber.

SUMMARY

The present invention satisfies these needs. In one embodiment, the apparatus is useful for processing of a substrate having a surface with a center and a peripheral edge. The apparatus comprises (i) a process chamber having a gas distributor for distributing process gas in the process chamber; (ii) a support for supporting a substrate in the process chamber; (iii) a plasma generator for forming a plasma from the process gas in the process chamber; and (iv) a focus ring in the process chamber. The focus ring comprises (a) a wall surrounding the substrate to substantially contain the plasma on the substrate surface, and (b) a channel in the wall. The channel has an inlet adjacent to, and extending substantially continuously around the peripheral edge of the substrate surface. The inlet of the channel has a width w sized to allow a sufficient amount of process gas to flow into the channel to maintain substantially equal processing rates at the center and peripheral edge of the substrate surface.

An alterative embodiment comprises a process chamber for uniformly processing a substrate in process gas. The process chamber comprises (i) a gas distributor for introducing process gas in the process chamber; (ii) a process gas containment wall for directing the flow of process gas introduced through the gas distributor to the substrate; and (iii) a movable substrate holder. The movable substrate holder has (a) a first position suitable for loading the substrate thereon, and (b) a second position for processing of the substrate. In the second position, the movable substrate holder and the process gas containment wall define a channel therebetween. The channel has an inlet adjacent to and extending substantially continuously around a peripheral edge of the substrate.

The invention further comprises a method of uniformly processing a substrate in a process chamber. The method comprises the steps of (a) placing a substrate in the process chamber, the substrate having a surface with a center and a peripheral edge; (b) introducing process gas in the process chamber, and maintaining the process gas at process conditions suitable for processing the substrate; and (c) maintaining a wall having a substantially continuous channel adjacent to, and around the peripheral edge of the substrate surface, the channel having an inlet sized and configured to regulate the flow of process gas into the channel so that the center of the substrate is processed at a processing rate substantially equivalent to a processing rate at the peripheral edge of the substrate.

DRAWINGS

These and other features, aspects, and advantages of the present invention will become better understood with regard to the following description, appended claims, and accompanying drawings which provide illustrative examples of the invention, where:

FIG. 3b is a partial cross-sectional schematic view of the process chamber of FIG. 3a, with the movable substrate support in a substrate processing position;

DESCRIPTION

The present invention provides an apparatus and method for uniformly processing a surface of a substrate using process gas and for reducing deposition of particulate contaminants on the substrate. The apparatus can be used to deposit material on the substrate, such as by chemical vapor deposition or sputtering processes; implant material in the substrate, such as by ion implantation processes; and is particularly useful for etching layers on the substrate, such as by chemical etching or reactive ion etching processes.

Figure 1:
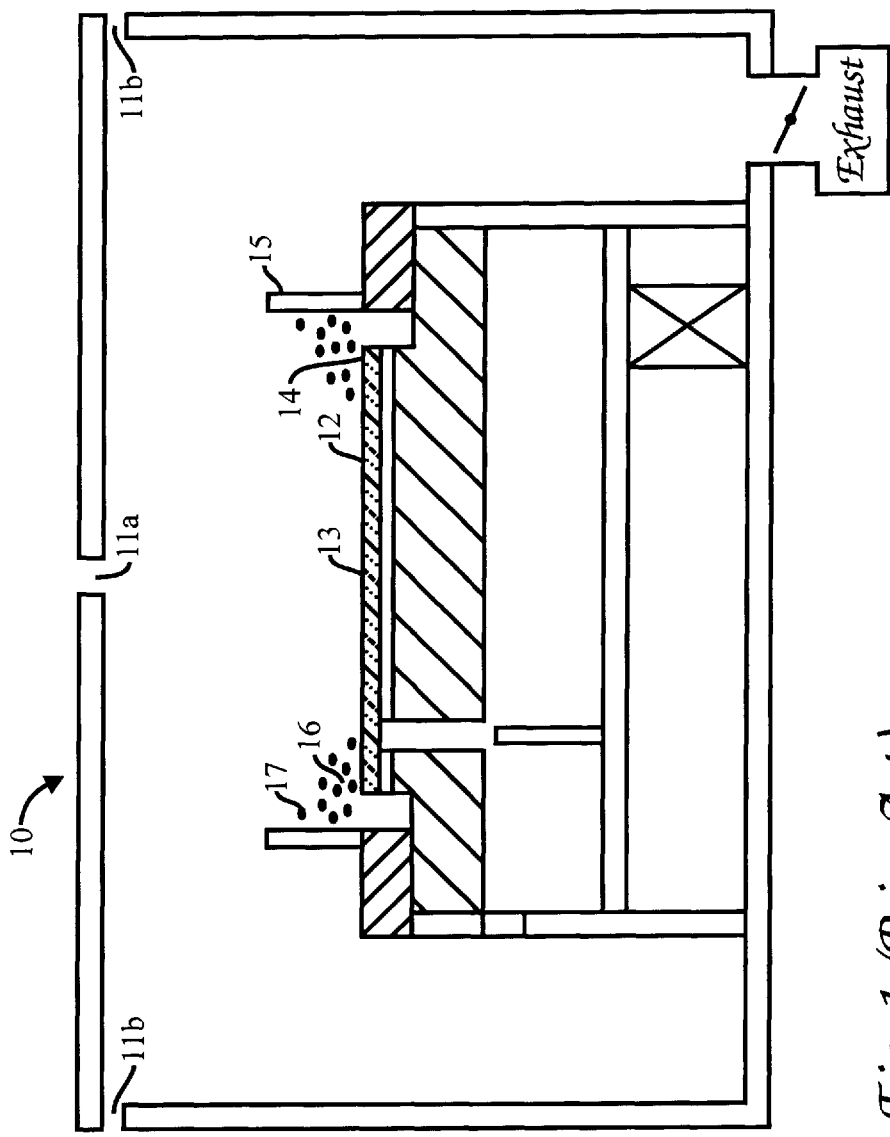
FIG. 1 (prior art) is a partial cross-sectional schematic view of a prior art apparatus showing formation of particulate contaminants near a peripheral edge of a substrate.
Figure 2:
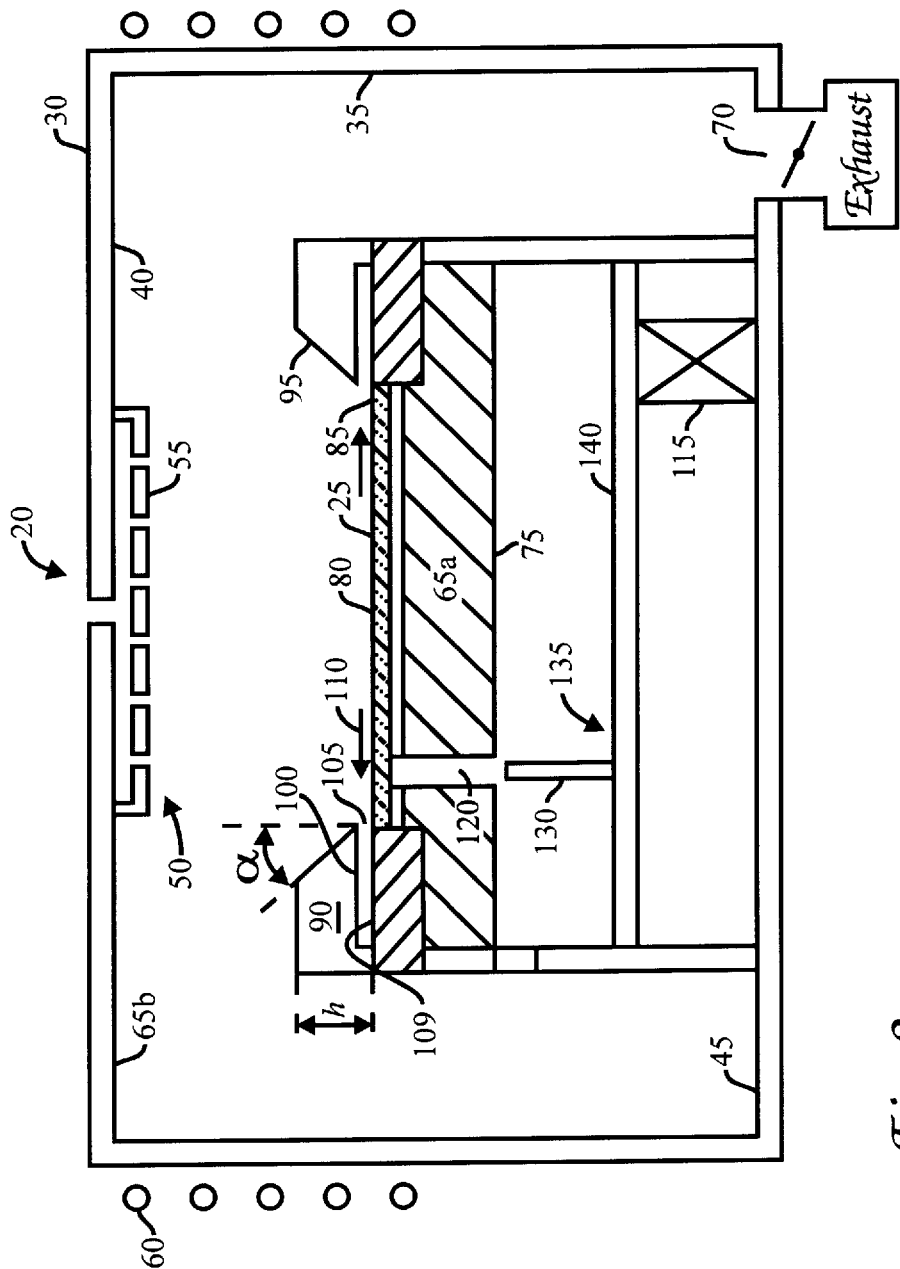
FIG. 2 is a partial cross-sectional schematic view of an apparatus according to the present invention showing a focus ring with a channel therein.

A schematic of an exemplary processing apparatus 20 of the present invention, suitable for plasma processing of a semiconductor substrate 25, is shown in FIG. 2. The process apparatus 20 is described in detail in U.S. patent application Ser. No. 08/277,531, filed Jul. 18, 1994, (AM 609) which is incorporated herein by reference. The particular embodiment of the apparatus 20 shown herein is provided only to illustrate operation of the invention and should not be used to limit the scope of the invention. For example, the apparatus 20 can be used for non-plasma processes as described above, and can be used for manufacturing processes other than semiconductor fabrication.

The apparatus 20 generally comprises an enclosed process chamber 30 having a sidewall 35, a top wall 40, and a bottom wall 45. Process gas which used to deposit material on, or etch the substrate 25, is introduced into the chamber 30 through a gas distributor 55 having a perforated "showerhead" gas diffuser for distributing the process gas in the chamber 30. A plasma can be formed from the process gas by inductive coupling using an inductor coil 60 wound around the chamber 30, or by capacitive coupling using process electrodes 65a, 65b in the chamber 30. In the example shown, one of the process electrodes 65a is located below the substrate 25, and the other process electrode 65b is formed by electrically grounding the walls of the process chamber 30. Combined inductive and capacitive coupling can also be used to form a more uniform or directed plasma in the chamber 30. An exhaust manifold 70 is provided for withdrawing spent process gas and process gas byproducts from the process chamber 30. A substrate support 75 is provided to hold a substrate 25 having a center 80 and a peripheral edge 85 in the process chamber 30.

A focus ring 90 surrounding the substrate 25 can be designed as (i) a free-standing ring structure resting on the substrate support 75 as shown in FIG. 2; or (ii) an integral portion of the substrate support 75 (not shown); or (iii) a fixed ring structure attached to the sidewall 35 of the process chamber 30, as illustrated in FIG. 3.

The focus ring 90 comprises a containment wall 95 surrounding the substrate 25 for containing and directing the flow of process gas or plasma on the substrate 25. The wall 95 guides the flow of fresh reactive process gas species from the gas distributor 55 to the substrate 25, while limiting flow or diffusive transport of stagnant process gas species circulating in the process chamber 30 to the substrate 25. Preferably, the inner diameter d of the wall 95 is sized to encircle the substrate 25, for example, for substrates having a diameter of 203.2 mm (8-inch), a suitable inner diameter d is from about 203 mm to about 250 mm, and more preferably from about 203 to 225 mm. The height h of the wall 95 is sufficiently long to reduce the flow or diffusive transport of stagnant reactive process gas species circulating in the process chamber 30 to the substrate 25, while simultaneously directing the flow of fresh reactive process gas species from the gas distributor 55 to the substrate 25. Thus, the height h of the wall 95 depends upon the process conditions in the process chamber 30. A suitable height h for a 150 to 300 mm (6 to 12 inch) diameter substrate processed using the process conditions described herein is from about 10 to about 50 mm, and more preferably 15 to 25 mm. Preferably, the inner surface of the wall 95 forms an angle $\alpha$ with a vertical axis that is perpendicular to the plane of the substrate 25, to form an inverted tapered conical surface that smoothly directs the flow of process gas from the distributor 55 to the substrate 25. Preferably, the angle $\alpha$ is from about 10° to about 75°, and more preferably from 15° to 40°, and most preferably about 30°.

The focus ring 90 further comprises a channel 100 having an inlet 105 adjacent to and extending substantially continuously around the peripheral edge 85 of the substrate 25. The channel 100 works in conjunction with the wall 95 to substantially enhance the distribution uniformity and reduce the concentration gradient of reactive process gas species across the substrate surface, and in particular, at the peripheral edge 85 of the substrate 25. The channel 100 also reduces the formation and deposition of contaminant particles on the peripheral edge 85 of the substrate surface, as explained below.

The size and geometry of the channel 100 is selected to regulate the radial flux of process gas across the peripheral edge 85 of the substrate 25, as shown by the arrows 110, by allowing a controlled amount of radially dispersing process gas to enter into the channel 100. An unrestrained or excessively restricted flow of process gas at the peripheral edge 85 of the substrate 25 can result in a non-uniform distribution of reactive process gas across the substrate surface resulting in nonuniform processing of the substrate 25. The channel 100 is dimensioned to allow a sufficient volume of non-reactive or exhausted process gas species to enter into the channel to maintain a substantially uniform concentration of fresh reactive process gas across the surface of the substrate 25, thereby resulting in substantially equal processing rates of the center 80 and peripheral edge 85 of the substrate. Thus, the inlet 105 of the channel 100 has a width w sized sufficiently narrow to limit the diffusive flow of process gas species from the peripheral edge 85 of the substrate 25 into the channel 100 so that only an amount of process gas substantially equivalent to the amount of spent process gas flows into the channel 100. Thus, the inlet width w of the channel 100 depends on the process conditions in the process chamber 30, and in particular on the pressure and flow rate of the process gas in the chamber 30. For a process gas pressure of 10 to 100 mTorr, the inlet width w is preferably from about 1 to 1000 mils, more preferably from about 1 to about 300 mils, and most preferably from 2 to 50 mils.

The length l of the channel 100 is sufficiently long to allow process gas, and in particular exhausted or spent process gas species, to continue to flow into the channel 100 during the entire processing cycle of the substrate 25, without restricting the flow of process gas to form gas stagnation regions at the peripheral edge 85 of the substrate 25 that result in formation of particulate contaminants that deposit on the substrate 25. Thus, the length l of the channel 100 also depends upon the pressure and flow rate of the process gas in the chamber 30, higher pressures and flow rates requiring longer channel lengths to allow process gas to flow in the channel 100 at effective flow rates. For example, when the pressure of the process gas in the chamber 30 is from about 10 mTorr to about 100 mTorr, a suitable length l of the channel 100 is least 10 mm, and more preferably from about 20 to about 100 mm, and most preferably from about 30 to about 70 mm.

Preferably at least a portion of a sidewall 109 of the inlet 105 of the channel 100 is substantially parallel to the substrate surface to maintain a substantially laminar flow of process gas across the peripheral edge 85 of the substrate 25. This feature allows process gas to flow smoothly without disturbance from the center 80 to the peripheral edge 85 of the substrate 25 and into the inlet 105 of the channel 100, thereby increasing the uniformity of processing the peripheral edge 85 of the substrate.

Figure 3A:
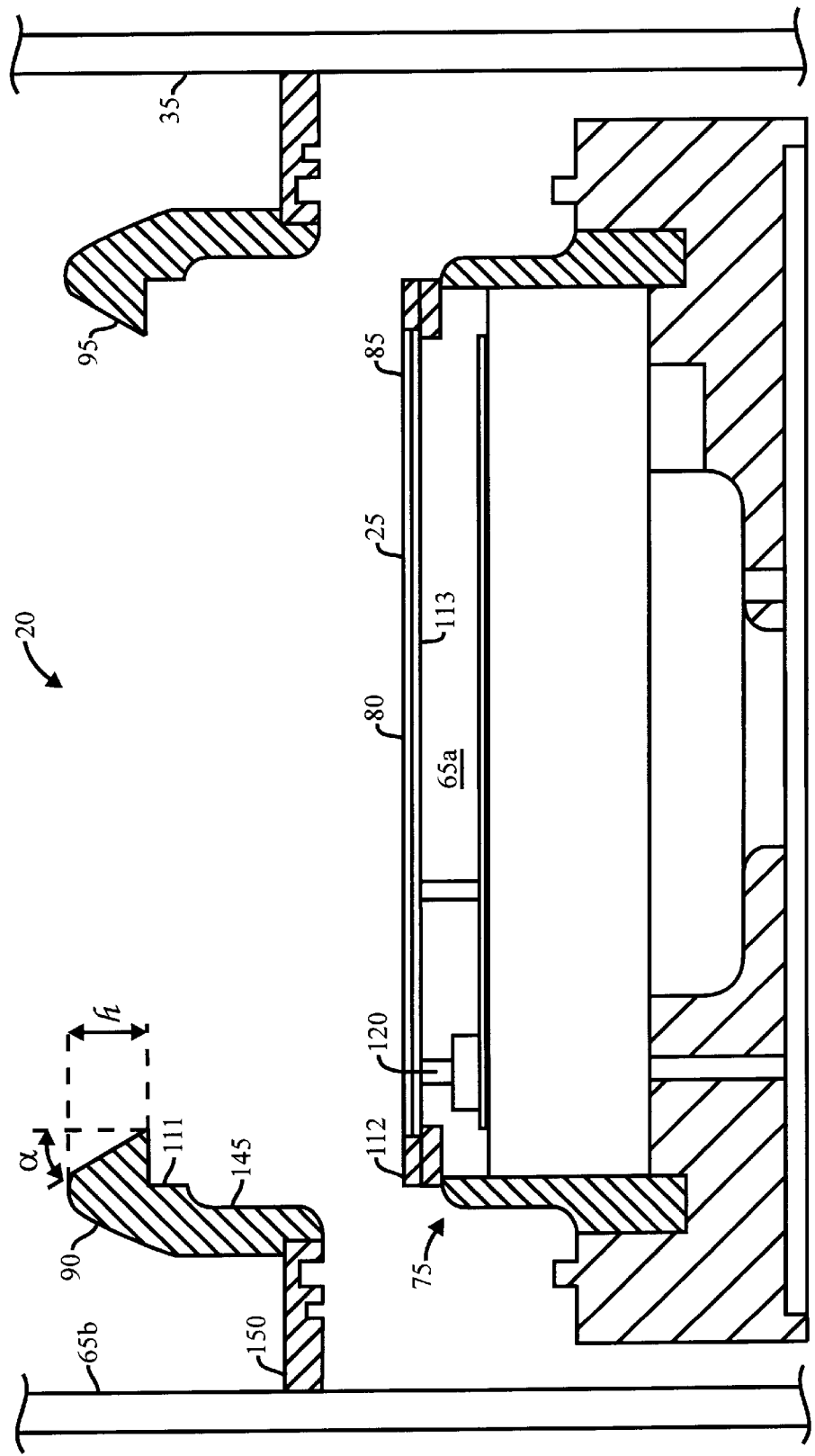
FIG. 3a is a partial cross-sectional schematic view of a process chamber of the present invention comprising (i) a fixed focus ring, and (ii) a movable substrate support in a substrate loading position.

In a preferred embodiment, the process chamber 30 comprises a stationary or fixed focus ring 90 attached to the process chamber 30, and a movable substrate support 75, as illustrated by FIGS. 3a and 3b. The channel 100 of the focus ring 90 is formed between a lower edge 111 of a fixed focus ring 90 and an upper edge 112 of the movable substrate support 75. The movable substrate support 75 is movable from (i) a first position suitable for loading a substrate 25 on the substrate holder, as shown in FIG. 3a, to (ii) a second position suitable for processing the substrate 25, as shown in FIG. 3b. The channel 100 between the fixed focus ring 90 and the movable substrate support 75 is formed when the movable substrate support 75 is in the second position. In the version shown herein, the first position is lower than the second position.

The movable support structure comprises a support plate 113 having a planar surface sized to support the substrate 25 and a plurality of holes 120 therethrough. The movable substrate support 75 is vertically raised or lowered by support lift bellows (not shown).

In this version, the fixed focus ring can have any of the previously described configurations. A preferred structure for attaching the fixed focus ring 90 to the process chamber 30 comprises (i) an annulus 145 extending below the focus ring 90, and (ii) an arm 150 for attaching the annulus 145 to the sidewall 35 of the process chamber 30. A portion of the edge of the focus ring 90, annulus 145, and arm 150 has a shape conforming to the edge 112 of the movable support structure 75, to define a channel 100 between the focus ring 90 and the movable support structure 75. The width w of the channel 100 can be adjusted by lifting or lowering the movable support structure, and the length l of the channel 100 is the length between the conforming portions of the fixed focus ring 90 and the movable substrate support 75.

The fixed focus ring 90 and the movable substrate support 75 configuration has several advantages. First, the fixed focus ring 90 reduces generation of contaminant particles formed by dislodging deposits on the focus ring 90, during movement of the focus ring 90. This provides a cleaner process environment and higher substrate 25 yields.

Furthermore, design of the components in the chamber 30 is simplified by allowing moving parts, such as the substrate lifting pin assembly 135, to be located in the lower region of the chamber 30 which is substantially free from corrosive process gas, as shown in FIG. 2. A suitable lifting pin assembly 135 comprises a C-shaped ring 140 bearing four lifting pins 130, the ring raised and lowered by lifting pin bellows 115. The lifting pins 130 can extend through holes 120 of the substrate support to raise or lower the substrate 25.

Another advantage is that the movable substrate support 75 allows adjustment of the width w of the inlet 105 of the channel 100 to tailor the dimension of the channel 100 to particular process conditions and chamber geometries. Furthermore, the first lower position of the movable substrate support 75 facilities loading and unloading of substrates 25 into the chamber 30.

The various components in the process chamber 30, and the chamber itself, can be made from a variety of materials including metals, ceramics, glasses, polymers and composite materials, using conventional machining and molding methods. Preferred metals that are used to fabricate the process chamber 30 and components include aluminum, anodized aluminum, "HAYNES 242," "AI-6061," "SS 304," "SS 316," and INCONEL.

The apparatus 20 described herein can be used to deposit material on the substrate 25 such as by chemical vapor deposition, etch material from the substrate 25, or clean contaminant deposits deposited on the substrate 25, chamber walls, and processing components. Typical chemical vapor deposition (CVD) processes for depositing $SiO_2$ on a substrate, use process gases such as (i) silicon source gas for example $SiH_4$ or $SiCl_2H_2$, and an oxygen source gas such as $CO_2$ and $H_2$, or $N_2O$; or (ii) a single gas containing both silicon and oxygen such as $Si(OC_2H_5)_4$. CVD processes for depositing $Si_3N_4$ typically use gases such as $SiH_4$ and $NH_3$ or $N_2$. Other conventional CVD process gases include $NH_3$, $AsH_3$, $B_2H_6$, $HCl$, $PH_3$ and $SiH_4$. Typical metal interconnect etching processes use etching process gases such as $BCl_3$, $Cl_2$, $SF_6$, $CF_4$, $CFCl_3$, $CF_2Cl_2$, $CF_3Cl$, $CHF_3$, and $C_2ClF_5$. Resist etching processes typically use oxygen gas to etch the polymeric resist on the substrate.

The apparatus 20 is particularly useful in plasma processes for forming and maintaining a uniform distribution of reactive plasma species across the substrate surface by regulating the flow of process gas at the peripheral edge 85 of the substrate 25. For example, a typical plasma or reactive ion etching process that can be performed in the apparatus 20 uses a plasma of a chlorine-containing gas to etch conductive layers on the substrate 25, as generally described in *VLSI Technology, Second Edition,* Chapter 5, by S. M. Sze, McGraw-Hill Publishing Co., New York (1988), which is incorporated herein by reference. Plasma processes that use $NF_3$ to clean substrates are generally described in U.S. Pat. No. 5,201,990, to Chang, et al., which is also incorporated herein by reference. Plasmas are also used for depositing coatings on the substrate, as in plasma-enhanced chemical vapor deposition processes as generally described in Chapter 9, VLSI Technology, 2nd Ed., Ed. by Sze, McGraw-Hill Publishing Co., New York, which is incorporated herein by this reference.

EXAMPLES

The following examples illustrate use of the apparatus and method of the present invention for processing of semiconductor substrates. However, the apparatus and method can be used in other applications as would be apparent to those skilled in the art. Thus, the scope of the present invention should not be limited by the illustrative examples provided herein.

Examples 1 and 2

Etched Substrates

Figure 4B:
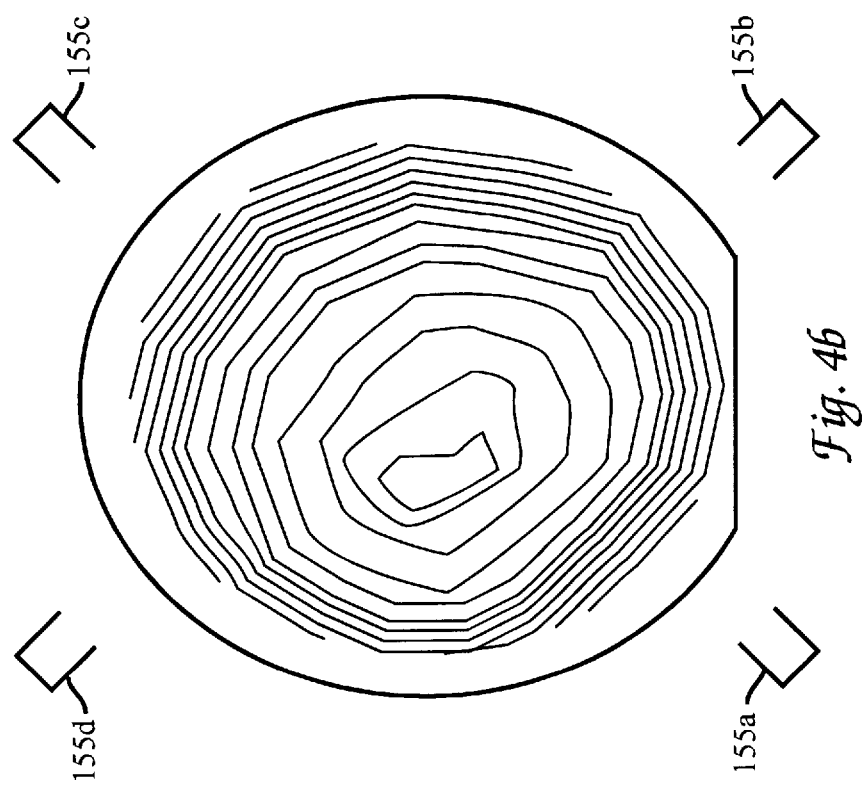
FIG. 4b shows a contour graph of the variations in the rate of etching of an aluminum layer on a substrate for a symmetric gas flow distribution.
Figure 4A:
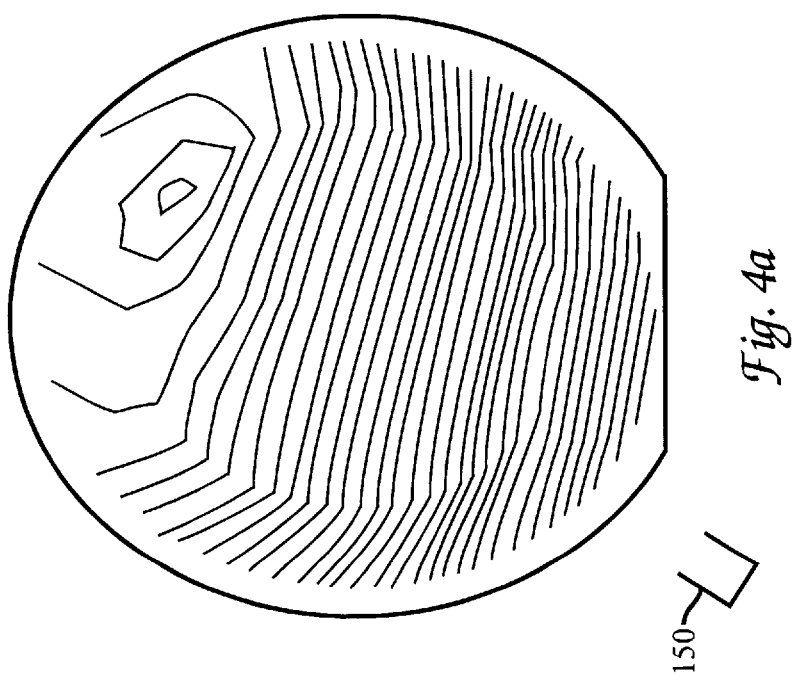
FIG. 4a shows a contour graph of the variation in the rate of etching of an aluminum layer on a substrate for an asymmetric gas flow distribution.

The following examples demonstrate that a non-uniform concentration of reactive process gas across the substrate surface affects the uniformity of etching of an aluminum layer on a substrate 25. In each example, a substrate 25 having an aluminum layer was loaded in the process chamber 30, and process gas comprising 100 sccm $Cl_2$ and 40 sccm $BCl_3$ was introduced in the process chamber 30. In Example 1, the process gas was introduced into the chamber 30 via a single gas distributor 150 positioned above a portion of the peripheral edge 85 of the substrate 25, as shown in FIG. 4a, to provide an asymmetrical flow of gas across the substrate surface. In Example 2, the process gas was introduced into the chamber 30 via four gas distributors 155a, 155b, 155c, 155d positioned symmetrically around the peripheral edge 85 of the substrate 25, as shown in FIG. 4b, to provide a symmetrical flow of gas across the substrate 25. In both examples, the chamber 30 was maintained at a pressure of 12 mTorr; and a plasma was generated using an RF bias of 1000 Watts applied to the two process electrodes 65a, 65b in the chamber 30. The etching processes were stopped at an endpoint determined by monitoring the intensity of the 4835 Å carbon dioxide optical emission line.

FIG. 4a shows a contour graph of the variation in thickness of the etched aluminum layer across the substrate 25 processed in Example 1, in which process gas was introduced into the process chamber 30 via a single gas distributor 150 positioned above the peripheral edge 85 of the substrate 25. This configuration provides an asymmetric flow of process gas across the surface of the substrate 25. The contour graph shows that significantly higher etch rates were obtained at the peripheral portion of the substrate 25 near the gas distributor 150, than the etch rates obtained at portions of the substrate 25 distal from the gas distributor 150.

FIG. 4b shows a contour graph corresponding to the variation in thickness of the etched aluminum layer across the substrate 25 processed in Example 2, which used a symmetric gas flow distribution. This contour graph shows symmetric etch rates, with the highest etch rates obtained along the peripheral edge 85 of the substrate 25 directly below the four gas distributors 150a, 150b, 150c, 150d, and the lowest etch rates at the center 80 of the substrate 25.

The etch pattern contour graphs demonstrate that process gas flow distribution and mass concentration across the substrate surface dominate the uniformity of processing of the substrate 25. The energetic charged plasma species that are attracted to the electrically biased process electrode 65a located below the substrate 25 form a minor component in etching of the substrate 25. In contrast, the process gas flow across the substrate surface, which is affected by the location of the gas distributor in the chamber 30, appear to significantly affect the uniformity of etching of the substrate 25.

Example 3

Finite Element Analysis Model

A simplified mathematical model was developed to explain the experimentally observed etching patterns for the different process gas flow configurations used in Examples 1 and 2. In the model, it was assumed that (i) diffusion and convection were the primary mechanisms of mass transport of electrically neutral reactive species during the etch process, (ii) magnetic field, thermal diffusion, and pressure diffusion effects were regarded as insignificant, and (iii) the only significant etching process was the one occurring at the surface of the substrate.

A three-dimensional finite element analysis program was then used to predict the distribution of reactive process gas, and in particular reactive plasma species, on the surface of a substrate during a typical etching process. The finite element analysis program solved the following differential equations under appropriate boundary conditions:

Diffusion transport of a gas, $F_d = -D\nabla n$, where F is the diffusive flow, D is the diffusion coefficient; and $\nabla v$ is the concentration gradient;

Convective transport of a gas, $F_c = \Delta n$;

RMS diffusive displacement (Einstein equation) is given by, $\bar{x} = \sqrt{2Dt}$, where D is diffusion coefficient;

Diffusive displacement velocity, $V_{diff} = \sqrt{2D}$; and

Convention velocity is dominant when the $V >> V_{diff}$.

The finite element analysis program was used to run numerical simulations to determine the radial flux or flow of reactive process gas across the substrate surface for the process configurations used in Examples 1 and 2. The numerical simulations generated by the program showed a radial flux gradient across the substrate surface that corresponded to the experimentally observed etching patterns of Examples 1 and 2, thereby validating the assumptions of the model.

Example 4

Concentration Gradient Contour Maps

The finite element program was used to generate numerical simulations for various gas inlet positions and focus ring configurations to determine gas flow structures and configurations that enhance the uniformity of distribution of reactive process gas across the substrate surface.

Figure 5B:
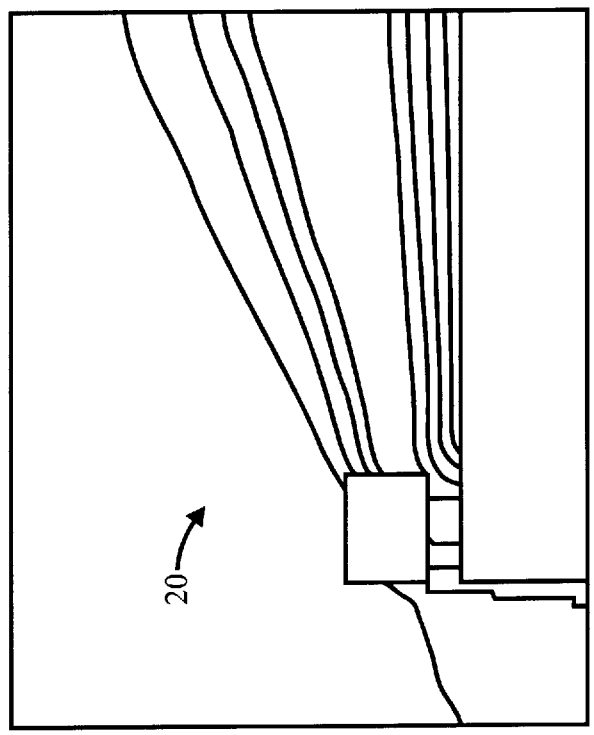
FIG. 5b is a contour map of the concentration gradient of reactive process gas species obtained using a focus ring and channel of the present invention.
Figure 5A:
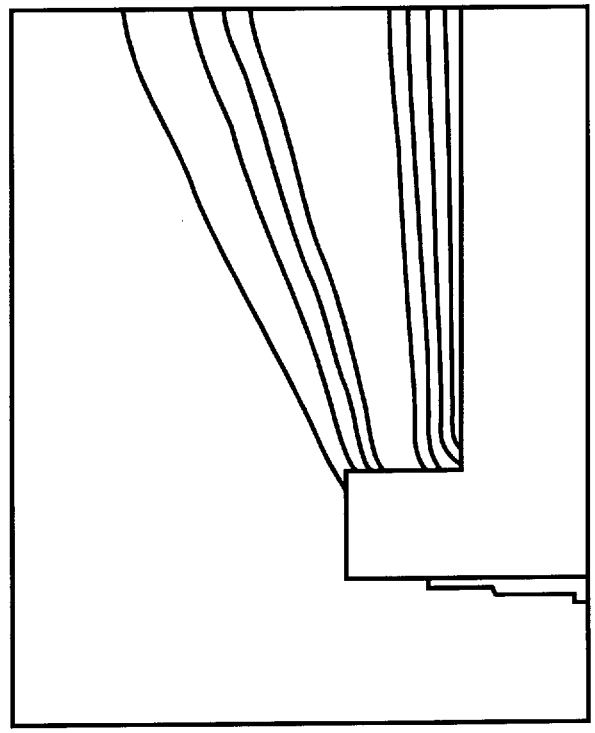
FIG. 5a (prior art) is a contour map of the concentration gradient of reactive process gas species obtained using a conventional focus ring.

The numerical simulations generated by the finite element analysis program were used to map the process gas flow distribution and concentration of reactive process gas species, from the center 80 to the peripheral edge 85 of the substrate 25. In the simulations, the distributor 50 was positioned directly above the center 80 of the substrate 25. FIG. 5a shows a contour map of the numerically simulated concentration gradient of reactive process gas species, such as etchant species, that results from use of a focus ring 90 resting on the substrate support 75. FIG. 5b shows a contour map of the numerically simulated concentration gradient of reactive process gas species that results from a focus ring 90 of the present invention that includes a channel 100 having an inlet 105 adjacent to, and extending substantially continuously around, the peripheral edge 85 of the substrate 25. The concentration gradient shown in FIG. 5b demonstrates that positioning a continuous channel 100 close to the peripheral edge 85 of the substrate 25 provides uniform gas flow distribution at the peripheral edge 85 of the substrate 25.

Examples 5–9

Figure 6:
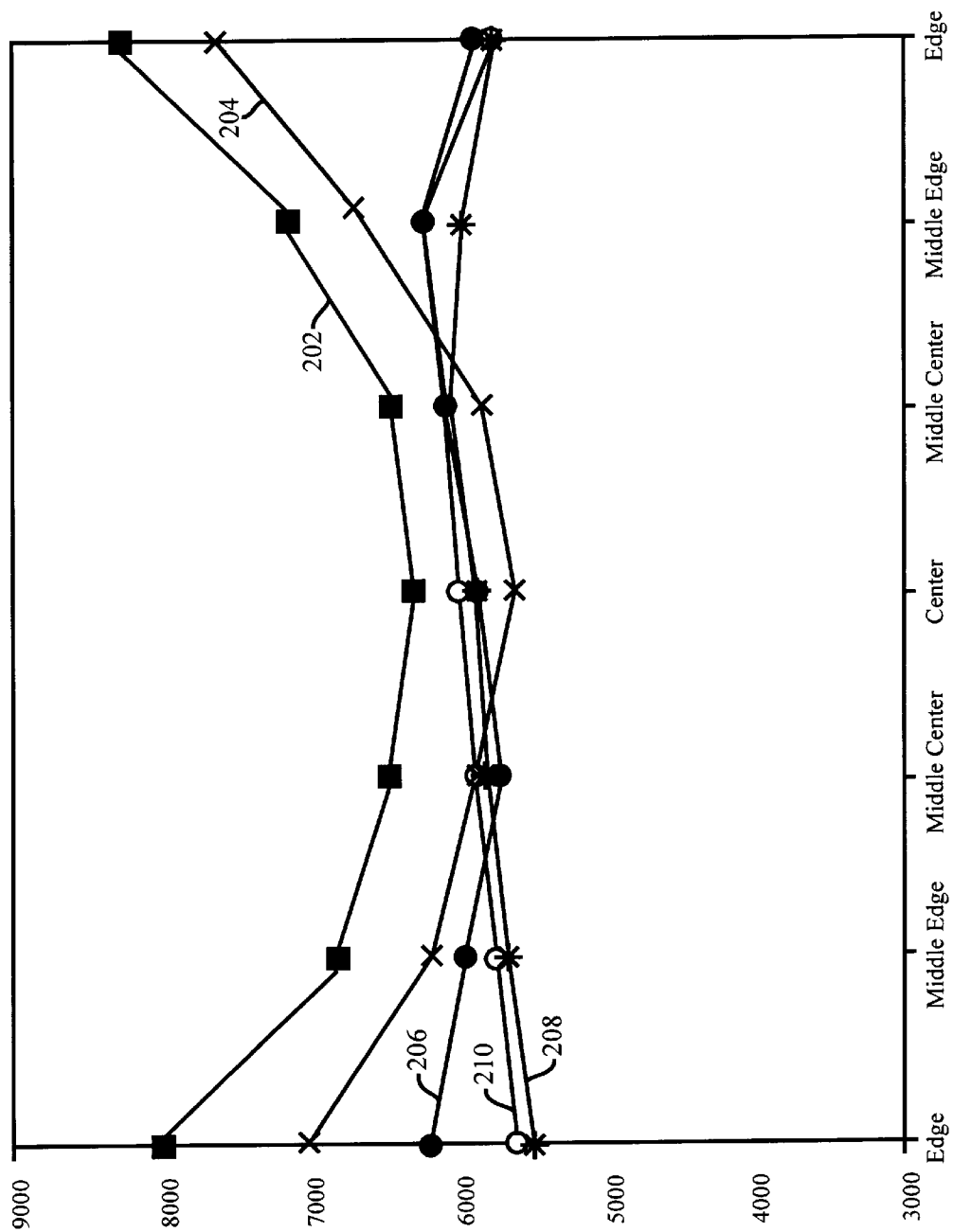
FIG. 6 is a graphical summary of the variation in processing uniformity across the surface of the substrate that is obtained for different gas distributor, focus ring, and channel configurations.

In Examples 5–9 actual experiments were run to determine the etching uniformity of substrates 25 that were etched using different process gas distributor 50, focus ring 90, and channel configurations. In these examples, an aluminum layer on a silicon substrate 25 was etched using process gas comprising 71 sccm $Cl_2$ and 29 sccm $BCl_3$ at a chamber pressure of 12 mTorr. The power applied to the inductor coils 60 of the chamber was 800 Watts, and the bias power applied to the process electrodes 65a, 65b was 190 Watts. FIG. 6 is a graphical summary showing the variation in etch rates across the surfaces of the substrates 25 processed in these examples.

Example 5 used a gas distributor 50 located above the center 80 of the substrate 25, without use of a focus ring 90. Line 202 of FIG. 6 shows the variation in etch rate obtained for this example, the total variation in etch rate being about 19.4%. This example showed that a focus ring 90 is necessary to contain the gas flow about the substrate 25 even when the gas distributor 50 is located above the center 80 of the substrate 25.

In Example 6, the process gas distributor 50 comprised multiple holes located around the peripheral edge 85 of the substrate 25. No focus ring 90 was used. Line 204 shows the variation in etch rate obtained, the total variation in etch rate across the substrate 25 being about 16.12%.

In Example 7, the process gas distributor 50 comprised multiple holes located above the peripheral edge 85 of the substrate 25. A focus ring 90 having a height of 0.75 inches was placed around the substrate 25. Line 206 shows the variation in etch rate obtained, the total variation in etch rate being about 5.25%.

In Example 8, the process gas distributor 50 comprised multiple located above the peripheral edge 85 of the substrate 25. A focus ring 90 having a height of 1 inch was used. Line 208 shows the variation in etch rate obtained, the total variation in etch rate being about 4.87%.

In Example 9, the process gas distributor 50 was located about the peripheral edge 85 of the substrate 25. A focus ring 90 having a height of 0.75 inches was used, and a channel 100 having a width of 0.25 inches was positioned adjacent to the peripheral edge 85 of the substrate 25. Line 110 shows the variation in etch rate obtained, the total etch rate being about 4.95%.

These examples demonstrate the substantial improvement in uniformity of etch rate across the substrate surface that is obtained using a focus ring having a channel therein.

The present invention has been described in considerable detail with reference to certain preferred versions thereof; however, other versions are possible. For example, the present invention can be used for processing any substrate, and is not limited to processing of semiconductor substrates. Therefore the spirit and scope of the appended claims should not be limited to the description of the preferred versions contained herein.

What is claimed is:

1. A method of processing a substrate in a process chamber, the method comprising the steps of:
   (a) placing a substrate in the process chamber, the substrate having a surface with a center and a peripheral edge;
   (b) introducing process gas in the process chamber, and maintaining the process gas at process conditions suitable for processing the substrate; and
   (c) maintaining around the substrate, a wall having (i) a conical surface tapering toward a peripheral edge of the substrate, and (ii) a substantially continuous channel adjacent to, and around the peripheral edge of the substrate surface, the channel having an inlet sized and configured to regulate the flow of process gas into the channel.

2. The method of claim 1, wherein in step (c), fixed and movable portions of a focus ring are moved relative to one another to define the channel therebetween, the channel comprising an inlet having a width w sized so that during processing of a substrate, the processing rate at the peripheral edge of the substrate surface is from about 90% to about 110% of the processing rate at the center of the substrate surface.

3. The method of claim 1, wherein in step (b) the process gas in the process chamber is maintained at a pressure of from about 10 mTorr to about 100 mTorr, and wherein in step (c) fixed and movable portions of a focus ring are moved relative to one another to define the channel therebetween, the channel comprising an inlet having a width w of about 1 to about 1000 mils.

4. The method of claim 1, wherein the process gas in the process chamber is maintained at a pressure of from about 10 mTorr to about 100 mTorr, and wherein in step (c) the length l of the channel is from about 10 to about 100 mm.

5. The method of claim 1, wherein the substrate comprises a diameter of from about 150 to 300 mm, and wherein in step (c) the wall has a height h of from about 10 mm to about 50 mm.

6. The method of claim 1, wherein in step (c), the wall of the focus ring comprises a conical surface that tapers toward the peripheral edge of the substrate.

7. A method of processing a substrate in a process chamber, the method comprising the steps of:
   (a) placing a substrate in the chamber, the substrate having a surface with a center and a peripheral edge;
   (b) maintaining process gas in the chamber at process conditions suitable for processing the substrate; and
   (c) maintaining a wall having a substantially continuous channel adjacent to, and around the peripheral edge of the substrate surface, the channel comprising an inlet sized to provide a width w of about 1 to about 1000 $\mu$m for a process gas pressure of about 1 to 100 mTorr, whereby the flow of process gas into the channel provides substantially equivalent processing rates at the center and peripheral edge of the substrate surface.

8. A method of processing a substrate in a process chamber, the method comprising the steps of:
   (a) placing a substrate in the chamber, the substrate having a surface with a center and a peripheral edge;
   (b) maintaining process gas in the chamber at process conditions suitable for processing the substrate; and
   (c) maintaining a wall having a substantially continuous channel adjacent to, and around the peripheral edge of the substrate surface, the channel having an inlet sized to provide a length l of from about 10 to about 100 mm for a process gas pressure of about 1 to 100 mTorr, whereby the flow of process gas into the channel provides substantially equivalent processing rates at the center and peripheral edge of the substrate surface.

9. A method of processing a substrate in a process chamber, the method comprising the steps of:
   (a) moving movable and fixed portions of a focus ring in the chamber, toward one another, to define (i) a wall surrounding the substrate, and (ii) a substantially continuous channel in the wall; and
   (b) maintaining process gas in the chamber at process conditions suitable for processing the substrate, whereby the wall contains the process gas around the substrate and the channel allows spent process gas to flow therein to provide substantially equivalent processing rates at the center and peripheral edge of the substrate surface.

10. The method of claim 9 wherein in step (a), the wall comprises a conical surface tapering toward a peripheral edge of the substrate.

11. The method of claim 9 wherein in step (a), the channel in the wall is defined between the fixed and movable portions of the focus ring, and extends substantially continuously adjacent to, and around the peripheral edge of the substrate surface.

12. The method of claim 11 wherein the fixed and movable portions of the focus ring are moved sufficiently close to one another to define a channel having an inlet with a width w sized to process the peripheral edge of the substrate surface at a processing rate that is about 90% to about 110% of a processing rate at the center of the substrate surface.

13. The method of claim 10 wherein in step (a) the process gas in the process chamber is maintained at a pressure of from about 10 mTorr to about 100 mTorr, and wherein in step (b) the fixed and movable portions of the focus ring are moved toward another to define a channel therebetween, the channel comprising an inlet having a width w of about 1 to about 1000 mils.

14. An apparatus for processing a substrate having a surface with a center and a peripheral edge, the apparatus comprising:
   (a) a process chamber having a gas distributor for distributing process gas in the process chamber;
   (b) a support for supporting a substrate in the process chamber;
   (c) a plasma generator for forming a plasma from the process gas in the process chamber;
   (d) a focus ring in the process chamber, the focus ring comprising a fixed portion and a movable portion that cooperate to define (i) a wall surrounding the substrate to substantially contain the plasma on the substrate surface, and (ii) a channel in the wall, the channel having an inlet adjacent to, and extending substantially continuously around the peripheral edge of the substrate surface.

15. The apparatus of claim 14, wherein the inlet comprises a width w sized to allow a sufficient amount of process gas to flow into the channel during processing of the substrate that the peripheral edge of the substrate surface is processed at a processing rate that is from about 90% to about 110% of a processing rate at the center of the substrate surface.

16. The apparatus of claim 15, wherein the width w of the inlet is sized so that the etch rate at the peripheral edge of the substrate surface is within about 10% of the etch rate at the center of the substrate surface.

17. The apparatus of claim 15, wherein the width w of the inlet is about 1 to about 1000 mils for a pressure of process gas in the process chamber of about 10 mTorr to about 100 mTorr.

18. The apparatus of claim 14, wherein the channel comprises a length l sized to allow a sufficient amount of process gas to flow into the channel, during processing of the substrate, that substantially no process gas stagnates to form contaminant particulates at the peripheral edge of the substrate surface.

19. The apparatus of claim 18, wherein the length l of the channel is from about 10 mm to about 100 mm, for a pressure of process gas in the process chamber of from about 10 mTorr to about 100 mTorr.

20. The apparatus of claim 14, wherein at least a portion of a sidewall of the inlet of the channel is substantially parallel to the substrate surface to maintain a substantially laminar flow of process gas across the peripheral edge of the substrate surface.

21. The apparatus of claim 14, wherein the focus ring comprises (i) a fixed portion, and (ii) a movable portion, the channel being formed between the fixed and movable portion of the focus ring.

22. The apparatus of claim 14, wherein the wall of the focus ring comprises a height h sized sufficiently long to direct the flow of process gas from the gas distributor to the substrate while reducing the flow to the substrate of stagnant process gas species circulating in the process chamber.

23. The apparatus of claim 14, wherein the substrate comprises a diameter of from about 150 to 300 mm, and wherein the wall of the focus ring comprises a height h of from about 10 mm to about 50 mm.

24. The apparatus of claim 14, wherein the wall of the focus ring comprises a conical surface that tapers toward the peripheral edge of the substrate.

25. The apparatus of claim 24, wherein the conical surface of the wall forms an angle of from about 10° to about 75° with an axis substantially vertical to the surface of the substrate.

26. The apparatus of claim 14, wherein the gas distributor of the process chamber is located above the center of the substrate surface and is capable of distributing process gas substantially uniformly across the substrate surface.

27. A process chamber for uniformly processing a substrate in a process gas, the process chamber comprising:
   (a) a gas distributor for introducing process gas in the process chamber;
   (b) a gas containment wall for directing the flow of process gas introduced through the gas distributor to the substrate, the wall comprising a conical surface that tapers toward the peripheral edge of the substrate; and
   (c) a movable substrate holder having (i) a first position suitable for loading the substrate thereon, and (ii) a second position for processing of the substrate, wherein in the second position the movable substrate holder and the process gas containment wall define a channel therebetween, the channel having an inlet adjacent to and extending substantially continuously around a peripheral edge of the substrate.

28. The process chamber of claim 27, wherein the inlet of the channel comprises a width w sized to allow a sufficient volume of process gas to enter into the channel to substantially uniformly process the substrate.

29. The process chamber of claim 27, wherein the channel comprises a length l sized to allow a sufficient volume of process gas to enter into the channel to reduce formation of particulate contaminants at the peripheral edge of the substrate.

30. The process chamber of claim 27, wherein at least a portion of a sidewall of the inlet of the channel is substantially parallel to a surface of the substrate.

31. The process chamber of claim 27, wherein the wall of the focus ring comprises a height h sized sufficiently long for the wall to direct the flow of process gas from the gas distributor to the substrate while reducing the flow to the substrate of stagnant process gas species circulating in the process chamber.

32. The process chamber of claim 27, wherein the gas contaminant wall comprises a conical surface that tapers toward the peripheral edge of the substrate at an angle of from about 10° to about 75° with an axis substantially vertical to a surface of the substrate.

33. A process chamber for processing a substrate having a surface with a peripheral edge, the process chamber comprising:

(a) a gas distributor for distributing process gas in the process chamber;
(b) a plasma generator for forming a plasma from the process gas;
(c) a support for supporting a substrate; and
(d) a focus ring comprising (i) a wall surrounding the substrate to substantially contain the plasma on the substrate surface, and (ii) a channel having an inlet adjacent to, and extending substantially continuously around the peripheral edge of the substrate surface, the inlet having a width w of about 1 to about 1000 mils for a pressure of process gas of about 10 to 100 mTorr.

34. The process chamber of claim 33 wherein the channel comprises a length l of about 10 mm to about 100 mm, for a pressure of process gas in the chamber of from about 10 mTorr to about 100 mTorr.

35. The process chamber of claim 33 wherein the focus ring comprises a fixed portion and a movable portion, the channel being formed between the fixed and movable portions of the focus ring.

36. The process chamber of claim 33 wherein the wall of the focus ring comprises a conical surface that tapers toward the peripheral edge of the substrate.

37. The process chamber of claim 36 wherein the conical surface of the wall forms an angle of from about 10° to about 75° with an axis substantially vertical to the surface of the substrate.

38. A process chamber for processing a substrate having a surface with a peripheral edge, the process chamber comprising:

(a) a gas distributor for distributing process gas in the process chamber;
(b) a plasma generator for forming a plasma from the process gas;
(c) a support for supporting a substrate; and
(d) a focus ring comprising (i) a wall surrounding the substrate to substantially contain the plasma on the substrate surface, and (ii) a channel in the wall, the channel having an inlet adjacent to, and extending substantially continuously around the peripheral edge of the substrate surface, the channel having a length l of about 10 mm to about 100 mm for a pressure of process gas of about 10 mTorr to about 100 mTorr.

39. The process chamber of claim 38 wherein the channel comprises a width w of about 1 to about 1000 mils for a pressure of process gas of about 10 mTorr to about 100 mTorr.

40. The process chamber of claim 38 wherein the focus ring comprises a fixed portion and a movable portion, the channel being formed between the fixed and movable portions of the focus ring.

41. The process chamber of claim 38 wherein the wall of the focus ring comprises a conical surface that tapers toward the peripheral edge of the substrate.

42. The process chamber of claim 41 wherein the conical surface of the wall forms an angle of from about 10° to about 75° with an axis substantially vertical to the surface of the substrate.

43. A process chamber for processing a substrate having a surface with a peripheral edge, the process chamber comprising:

(a) a process chamber having a gas distributor for distributing process gas in the process chamber;
(c) a plasma generator for forming a plasma from the process gas;
(b) a support for supporting a substrate; and
(d) a focus ring comprising (i) a wall surrounding the substrate and having a conical surface that tapers towards the peripheral edge of the substrate, and (ii) a channel in the wall, the channel having an inlet adjacent to, and extending substantially continuously around the peripheral edge of the substrate surface, whereby process gas can flow into the channel.

44. The process chamber of claim 43 wherein the substantially the entire surface of the wall facing the substrate consists essentially of the conical surface.

45. The process chamber of claim 43 wherein the conical surface of the wall forms an angle of from about 10° to about 75° with an axis substantially vertical to the surface of the substrate.

46. The process chamber of claim 43 wherein the inlet of the channel comprises a width w of about 1 to about 1000 mils for a pressure of process gas of about 10 to 100 mTorr.

47. The process chamber of claim 43 wherein the channel comprises a length l of about 10 mm to about 100 mm for a pressure of process gas of about 10 mTorr to about 100 mTorr.

48. The process chamber of claim 43 wherein the focus ring comprises a fixed portion and a movable portion, the channel being formed between the fixed and movable portions of the focus ring.

49. A process chamber for processing a substrate having a surface with a peripheral edge, the process chamber comprising:

(a) a process chamber having a gas distributor for distributing process gas in the process chamber;
(c) a plasma generator for forming a plasma from the process gas;
(b) a support for supporting a substrate; and
(d) a focus ring comprising a wall surrounding the substrate, substantially the entire surface of the wall facing the substrate comprising a conical surface that tapers towards the peripheral edge of the substrate.

50. The process chamber of claim 49 wherein the conical surface of the wall forms an angle of from about 10° to about 75° with an axis substantially vertical to the surface of the substrate.

51. The process chamber of claim 49 wherein the wall comprises a channel having an inlet adjacent to, and extending substantially continuously around the peripheral edge of the substrate surface.

52. The process chamber of claim 51 wherein the inlet of the channel comprises a width w of about 1 to about 1000 mils for a pressure of process gas of about 10 to 100 mTorr.

53. The process chamber of claim 51 wherein the channel comprises a length l of about 10 mm to about 100 mm for a pressure of process gas of about 10 mTorr to about 100 mTorr.

54. The process chamber of claim 49 wherein the focus ring comprises a fixed portion and a movable portion, the channel being formed between the fixed and movable portions of the focus ring.

* * * * *